United States Patent
Esselbach et al.

(10) Patent No.: US 7,905,991 B2
(45) Date of Patent: Mar. 15, 2011

(54) VACUUM TREATMENT SYSTEM

(75) Inventors: Markus Esselbach, Feldkirch (AT); Martin Zaech, Balzers (LI); Orlaw Massler, Eschen (LI); Martin Grischke, Schaan (LI)

(73) Assignee: Oerlikon Trading AG, Trubbach, Trubbach (CH)

( * ) Notice: Subject to any disclaimer, the term of this patent is extended or adjusted under 35 U.S.C. 154(b) by 765 days.

(21) Appl. No.: 11/272,216

(22) Filed: Nov. 10, 2005

(65) Prior Publication Data
US 2006/0102077 A1 May 18, 2006

(30) Foreign Application Priority Data
Nov. 12, 2004 (CH) ........................ 1866/04

(51) Int. Cl.
*C23C 14/35* (2006.01)
(52) U.S. Cl. ......... 204/192.12; 204/298.11; 204/298.41; 204/192.38
(58) Field of Classification Search ............ 204/298.11, 204/298.16, 298.26, 298.27, 298.28, 298.41, 204/192.38, 192.12
See application file for complete search history.

(56) References Cited

U.S. PATENT DOCUMENTS

| | | | |
|---|---|---|---|
| 3,145,021 A | 8/1964 | Anderson | |
| 3,507,774 A | 4/1970 | Muly, Jr. | |
| 4,051,010 A * | 9/1977 | Roth et al. | 204/298.11 |
| 4,270,136 A | 5/1981 | Toyokura et al. | |
| 4,385,979 A | 5/1983 | Pierce et al. | |
| 4,446,702 A * | 5/1984 | Peterson et al. | 62/55.5 |
| 4,534,314 A * | 8/1985 | Ackley | 118/733 |
| 4,839,011 A * | 6/1989 | Ramalingam et al. | 204/192.38 |
| 4,885,075 A * | 12/1989 | Hillman | 204/298.09 |
| 6,319,369 B1 * | 11/2001 | Flynn et al. | 204/192.38 |
| 6,740,393 B1 * | 5/2004 | Massler et al. | 428/216 |
| 2004/0038033 A1 | 2/2004 | Massler et al. | |

FOREIGN PATENT DOCUMENTS

| | | |
|---|---|---|
| DE | 3404802 A1 | 8/1984 |
| DE | 19513614 C1 | 10/1996 |
| DE | 19651615 C1 | 7/1997 |
| DE | 100 18 143 A1 | 10/2001 |
| DE | 10018143 A1 | 10/2001 |
| DE | 10203730 A1 | 8/2003 |
| JP | 63-065611 * | 3/1988 |

OTHER PUBLICATIONS

Patent Abstracts of Japan, Sakamoto Akihisa, "Semiconductor Processing Apparatus and Method for Its Use", Publication No. 2000-332002, Publication Date Nov. 30, 2000, 1 page.
German Search Report, 10 2005 050 358.6, May 16, 2006.

* cited by examiner

*Primary Examiner* — Rodney G McDonald
(74) *Attorney, Agent, or Firm* — Pearne & Gordon LLP

(57) ABSTRACT

A vacuum treatment system (1) for treating workpieces has a treatment chamber (10) that can be evacuated and in which a low-volt arc-discharge device is placed, with at least one locking loading/unloading aperture and at least one coating source placed on one side wall of the treatment chamber. It also has a device for producing a magnetic field to create a remote magnetic field and at least one workpiece holder to hold workpieces. A target-shutter arrangement (8, 8') is designed so that when uncovered, the distance between the shutter (8) and the target (12) is less than 35 mm, thus allowing ignition and operation of a magnetron or cathode spark discharge behind the target, but preventing ignition of auxiliary plasma when the target (8) is turned off.

12 Claims, 6 Drawing Sheets

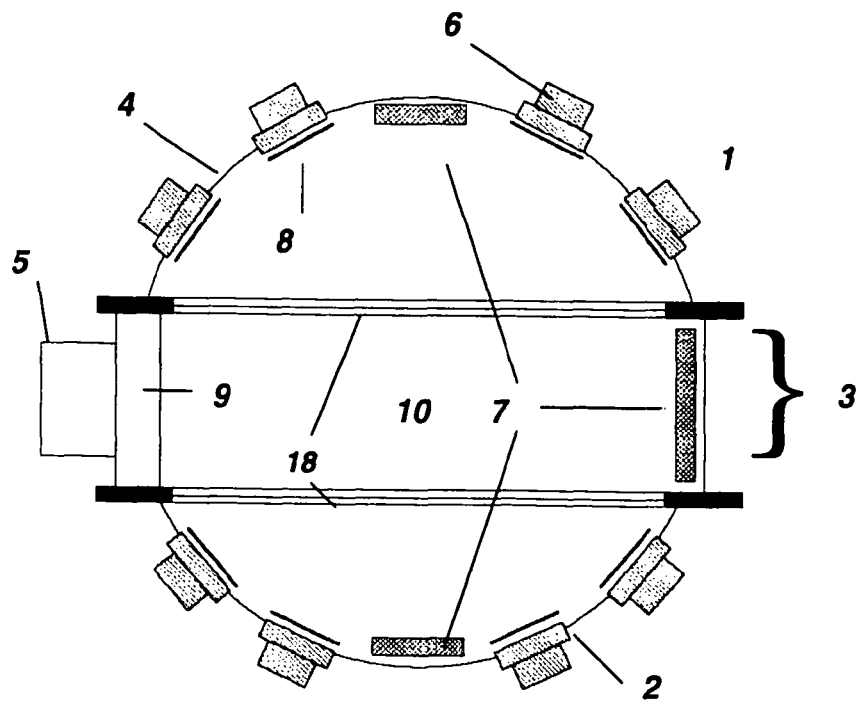
FIG 1)
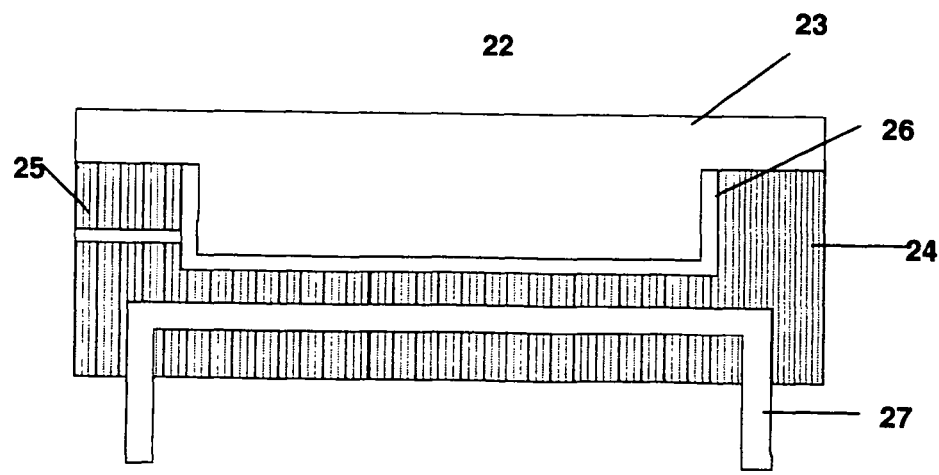
Fig 6)

FIG 2)
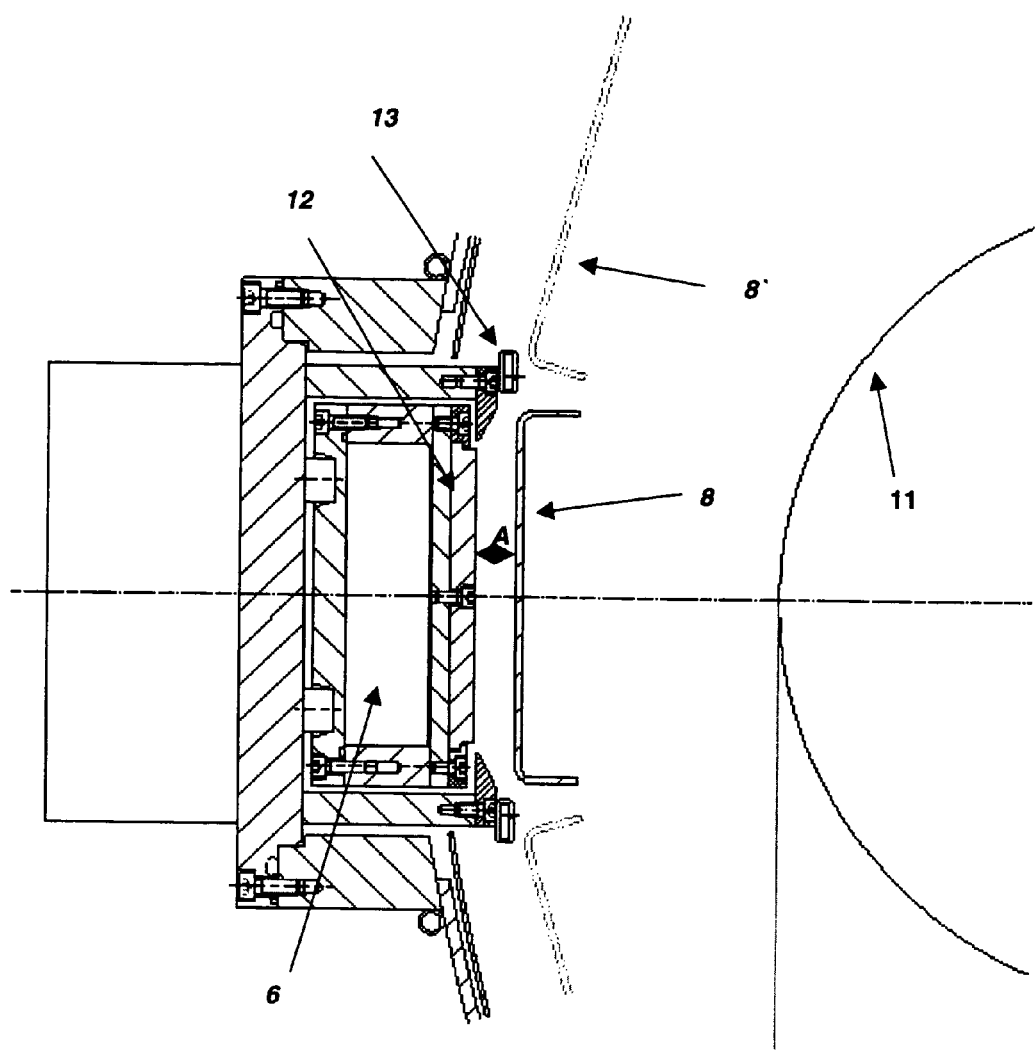

FIG 3)
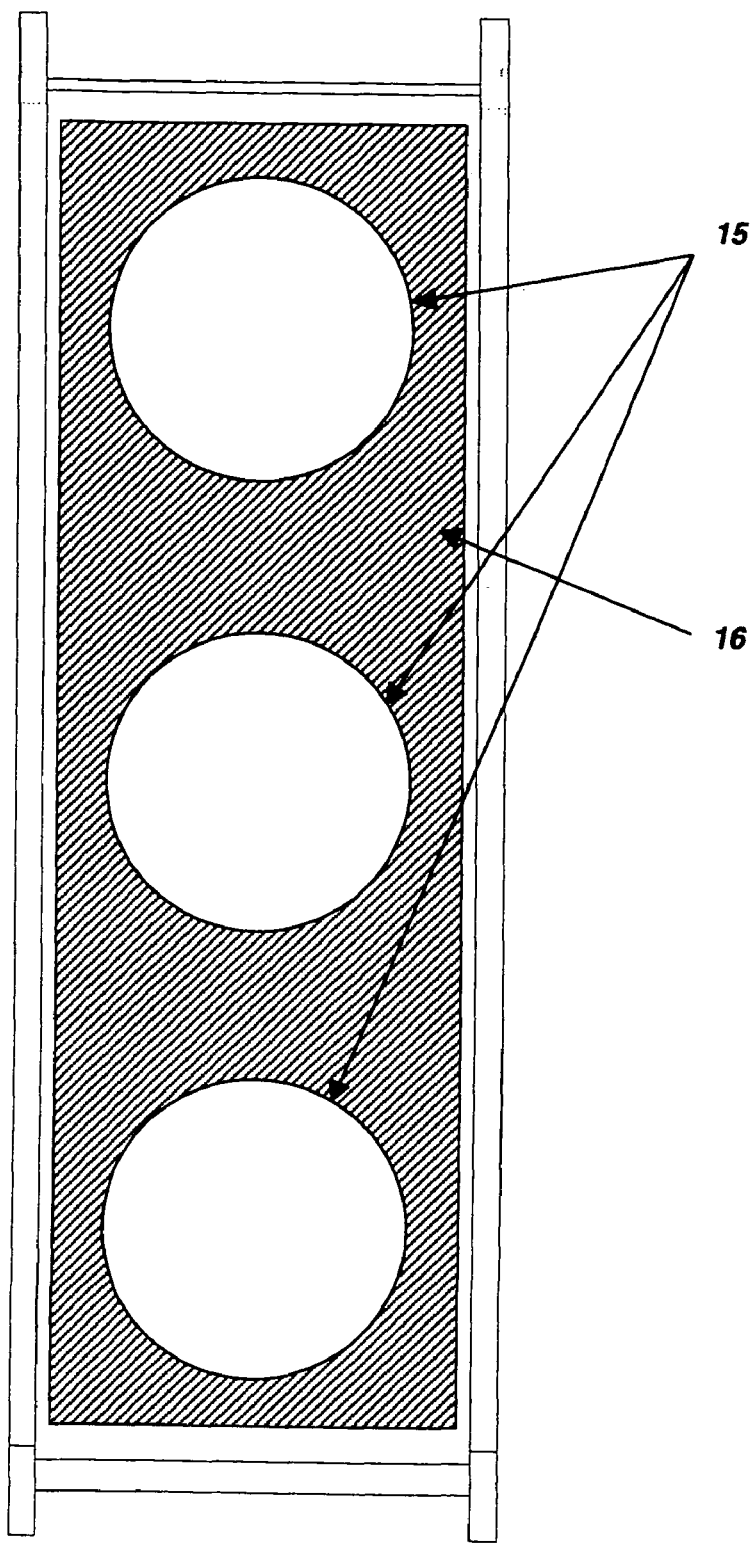

Fig 4)
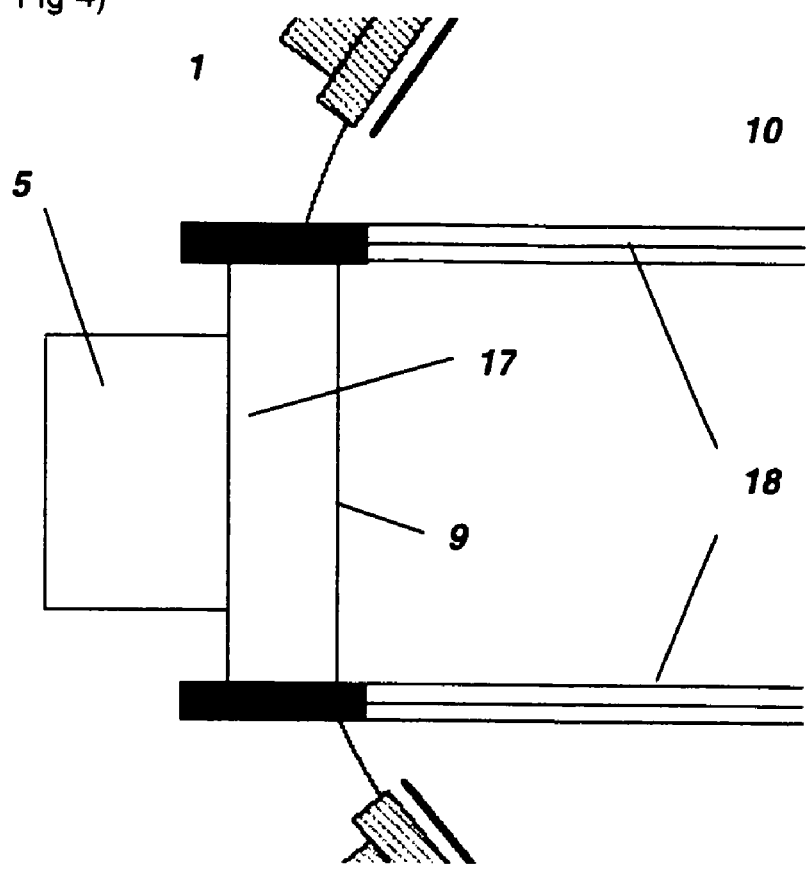
FIG 5)
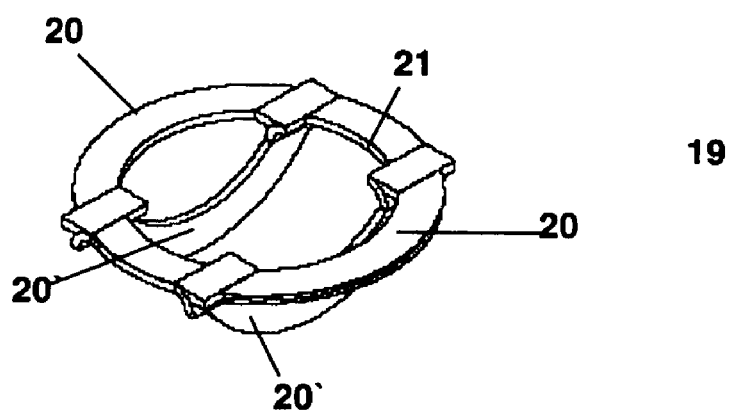

FIG 7)
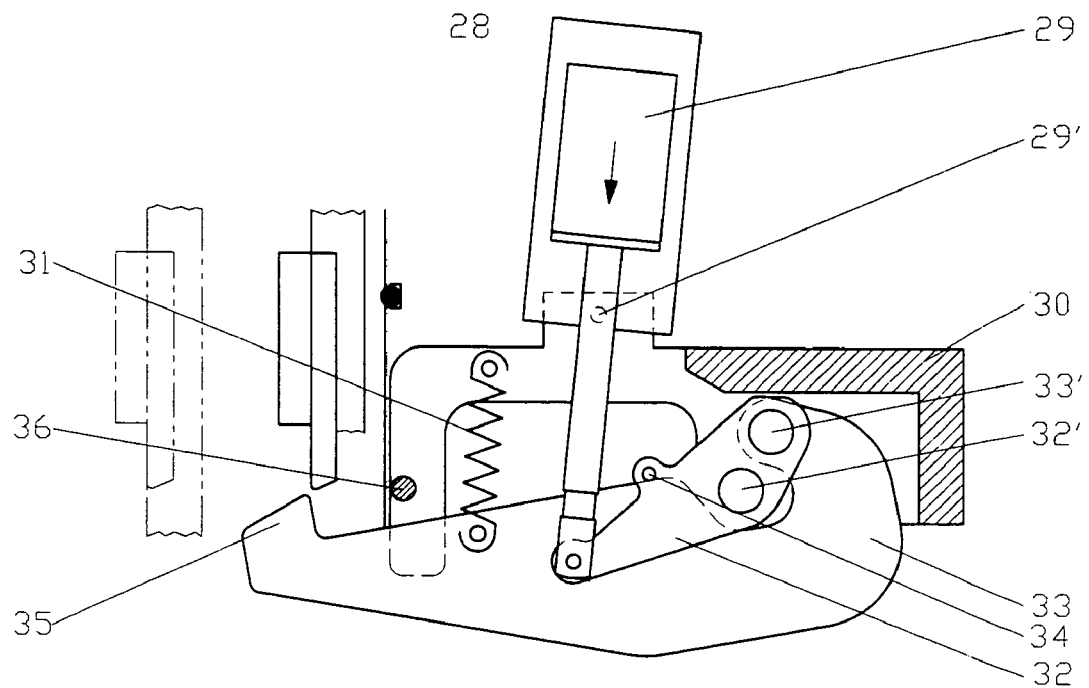
Doors latched or lock ready to latch
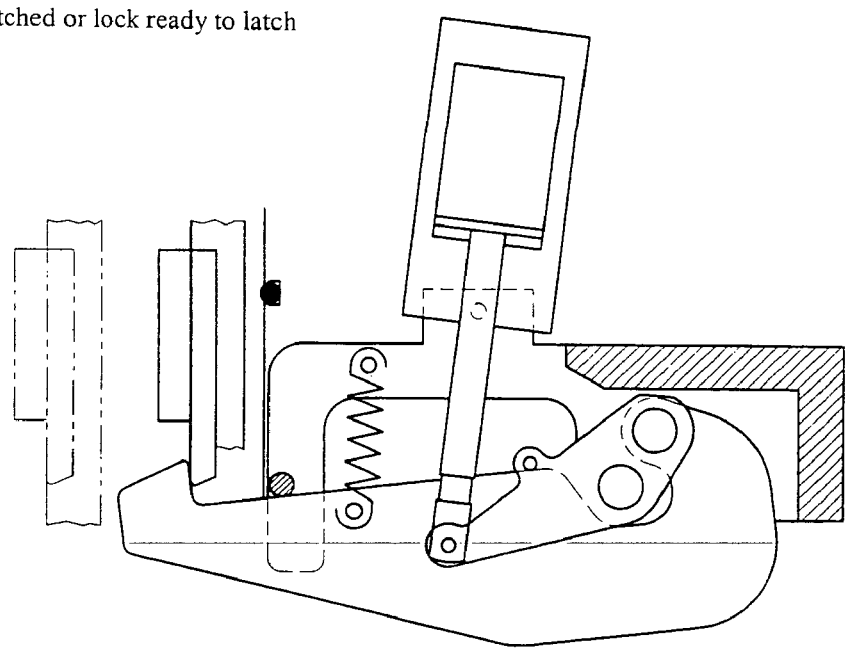

FIG 8)
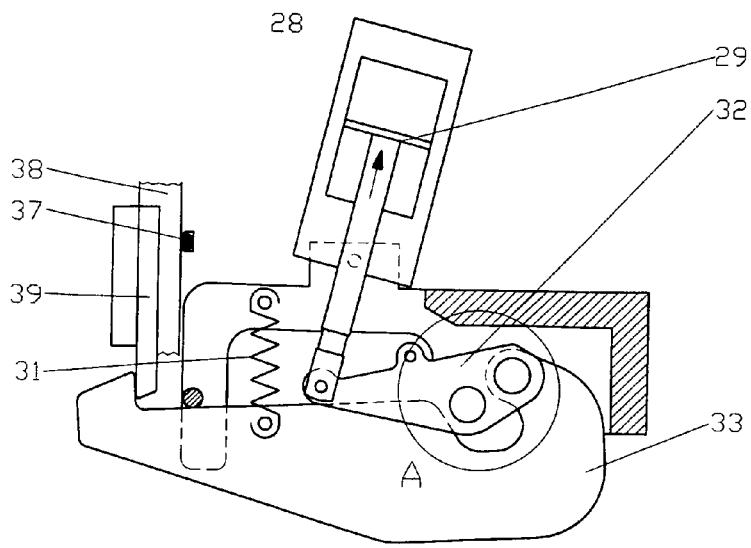
Detail A
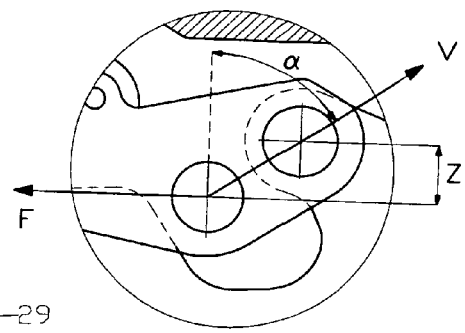
FIG 9)
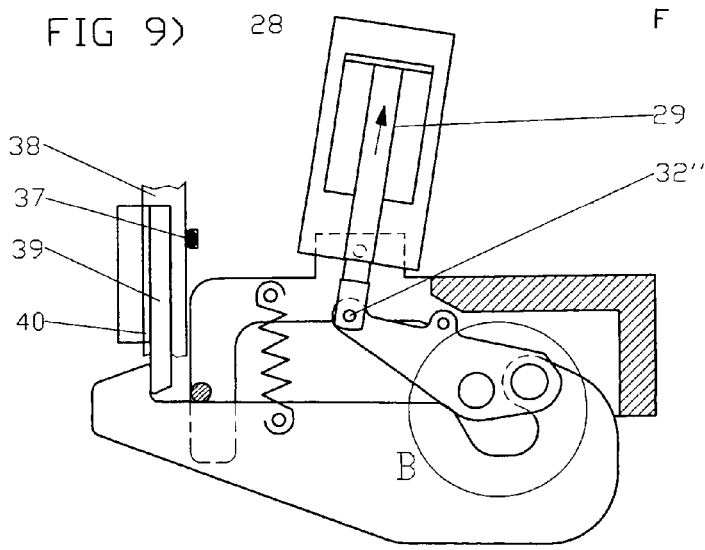
Detail B
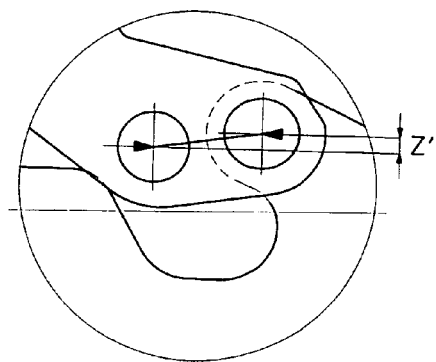

VACUUM TREATMENT SYSTEM

This invention concerns a vacuum treatment system for treating workpieces, with a treatment chamber that can be evacuated, in which there is a low-volt arc-discharge device, at least one coating source placed on one side wall of the treatment chamber, and at least one workpiece holder on which workpieces are mounted, on additional workpiece holders, if necessary.

This vacuum treatment system is mainly for DLC coatings and other vacuum-coating processes in which due to the process or the use of hazardous or explosive gases, special precautions must be taken for the reliability and safety or reproducibility of individual steps or whole sequences in a process because the demands are very high. However, other CVD, PVD or especially CVD/PVD combined coatings can be deposited advantageously. Examples cited here are WC/C, AlN, SiN, TiSiN, CrN layers and combinations of these coating systems.

The system has very high productivity, process safety and user friendliness achieved by the features in the following system components:
 target to shutter arrangement
 coil for remote electrical field
 chevron arrangement and geometry
 electrode (auxiliary anode)
 door lock

KNOWN STATE OF THE ART

The closest state of the art is regarded as DE 10018143, which is hereby declared an integral part of this application. This document describes a DLC coating, a process consisting of various heating, etching and coatings steps and a device for deposition of a corresponding DLC coating. With the vacuum system in the invention, the same and similar DLC coatings, inter alia, are deposited, and corresponding processes can be carried out to pretreat and deposit the corresponding coatings on workpieces.

Therefore this vacuum system also has the essential features of the devices described in DE 10018143, paragraph [0059] to [0068], FIGS. 1 and 2, and paragraphs [0076] to [0085]. For example, it least one pump system for producing a vacuum in a vacuum chamber, a gas-supply unit for feeding in process gas, an evaporator for preparing the coating material, a device for producing an arc for igniting and operating a DC low-volt arc, a device for producing a substrate bias voltage and at least one device for producing a magnetic field to create a remote magnetic field. More information can be obtained from the above-mentioned reference.

The basic steps in such a DLC process are briefly described below:
 a) insert at least one workpiece in a vacuum chamber and pump off to a pressure less than $10^{-4}$ mbar,
 b) heat and/or clean the substrate surface by electron bombardment, radiation heating and/or ion bombardment, using a low-volt DC arc, for example
 c) use plasma-supported evaporation on the adhesive layer by sputter or cathode arc processes, for example,
 d) apply a transitional layer to the adhesive layer by simultaneous plasma-supported evaporation of the adhesive layer component (PVD process) and deposition of carbon from the gas phase (CVD process),
 e) apply the diamond-like carbon [DLC] layer to the transitional layer by plasma-supported deposition of carbon from the gas phase.

If necessary, a low-volt DC arc can also be used to increase the plasma density in one or more of steps c) to e). Preferably, a medium-frequency substrate voltage is applied, at least during process steps d) and e).

Details on the process and potential variations can be found in DE 10018143, paragraph [0035] to [0058], and process examples 1 to 3.

DISADVANTAGES OF THE PRIOR ART

Despite the decisive advantages of the new coating system that can be produced with DE 10018143, the coating method and the device described therein can be further improved.

One disadvantage of medium or even high-frequency plasma processes is the increased risk of so-called auxiliary plasmas occurring at places where no plasma is needed. This takes unnecessary energy away from the treatment process, but it disrupts the process itself or other adverse side effects can occur. Therefore, it is difficult in the DLC process to achieve constant plasma conditions on all substrate surfaces. The gas is ionized mainly in the case of the cathode (within the glow/corona seam) in front of the substrates. In hollow spaces, for example inside a pipe or between two straight plates, a hollow cathode effect can then occur. In it, the electrons that cause ionization do not escape from the hollow space and wander to the anode, as is possible easily from open surfaces. The electrons then dangle back and forth between the cylinder walls and ionize extremely efficiently, so that very high local plasma densities can occur. As is known, to form a glow seam, the hollow space must be a certain minimum size and a certain geometric variable, for example, the pipe diameter or the distance between two parallel plates, must be larger than the pressure-dependent dark-space distance.

At the pressures common in the DLC process, around $5 \times 10^{-3}$ mbar, the dark-space distance is around 3 cm (which corresponds approximately to the free path length). Between two plates somewhat further apart, very intense auxiliary plasma can be observed. If the distance between the plates is increased even more, the plasma intensity quickly drops back down. At the same time, the effect due to greater or smaller overlapping and the width and length of the overlapping plate surfaces is increased or decreased. But, if the determining geometric size of the hollow space is below the free path length, no discharge can form.

It should also be noted that the plasma can wander from the plasma space into adjacent hollow spaces through connecting places, if the narrowest place at the pressure mentioned has a hole or gap diameter greater than 2 mm. But to prevent virtual leaks from forming, attention must simultaneously be paid to the capacity to evacuate such hollow spaces as they occur, for example with holders or behind target shutters, which is why the distances or evacuation ducts cannot be chosen as small as desired.

Another problem occurs with process step d), which is essential for adhesion, in which at the same time, chrome, for example, with a decreasing sputter capacity, is evaporated from one or more targets while, for example, an mf-plasma with an increasing percentage of carbon is run between the substrates and the system by adding a reactive gas containing a hydrocarbon.

In this way, the PVD and CVD processes running at the same time affect one another, and the target is at least partly occupied by a poorly conductive carbon layer, whereby the target voltage can be increased and arcing with droplet bombardment of the substrate surface can be triggered. This effect is weaker or stronger depending on the time this process overlap lasts.

Since the targets in step c) are preferably ignited first behind covers, so-called shutters, to prevent any potential contamination from being transferred to the substrate (free sputter) and in step d) the targets are usually turned off only after the shutter has run forward so as not to expose the turned off targets directly to DLC deposition by mf-plasma, the distance between the target and the shutter is set so it is greater than the dark-space distance of approx. 30 mm. This makes it possible to ignite the target safely behind the shutters. In any case, it is very difficult to prevent the formation of the plasma leak described above, since the individual components of the system change their mutual positions solely because of the thermal load occurring during the processes, and a short circuit between the shutter and target or anode frame must be prevented in all cases. Thus, during process step e) if auxiliary plasma is frequently formed between shutter and target, depending on the intensity of the auxiliary plasma, an insulating layer containing carbon, a DLC-type layer, graphite dust or the like is deposited on the target surface. These effects can result in the fact that the target surface must be cleaned after each coating with the chamber open, and the cathode must be free sputtered for a longer time.

A similar problem occurs when an auxiliary electrode, for example an auxiliary anode when a low-volt DC arc is used for the hot etching process, is coated with a nonconductive layer or one that is such a poor conductor that the low volt arc can no longer be ignited during the DLC process. And in this case, depending on the properties of the layer, expensive cleaning of the electrode surfaces after each insulation coating is often necessary. This problem is generally known, when in the deposition of any kind of insulating layers, DC electrodes, connected before the coating process, for example, are to be used for heating/etching purposes.

Since especially processes with gases containing hydrocarbons are frequently carried out at high gas throughputs, on one hand, and because of the process of decomposition in the plasma, there can also be an increase in molar volume, on the other hand, good pump capacity is essential. This is countered by using a so-called "chevron," which is put in or in front of the high-vacuum pump supports as an optical separation between the process chamber and the high-vacuum pump, to keep the HV pump from being contaminated by sputtering. A chevron can be made of annular rings arranged, for example, concentrically around a common midpoint (or center axis), but staggered one behind the other in depth. Due to the resultant reduction in cross section, pump capacity with conventional chevrons is reduced 30% to 50%, which is balanced out by a correspondingly larger, more expensive pump unit, if necessary.

For spatial plasma stabilization in low-volt arc-supported processes, the most homogeneous remote magnetic field possible has a favorable effect. For this, as is known, magnetic coils like a pair of Helmholtz coils can be placed in the upper and lower areas of the treatment chambers of vacuum systems to influence the plasma. But they interfere with the side loading/unloading process and access for service purposes, which is why such systems are usually designed as bottom loaders, and correspondingly high production halls and accesses are provided. If the diameter of a coil is made smaller for accessibility purposes, it has a negative impact on the homogeneity of the magnetic field.

Another disadvantage of the conventional vacuum-treatment systems, in which one or more auxiliary electrodes is exposed to high temperatures, is that in plasma processes that have reactive gas added, frequently good adhesive layers grow that can interfere with the next process. For example, an insulating layer (DLC, aluminum oxide, AlN, SiN, TiSiN, . . . ) can prevent re-ignition of the plasma of a low volt arc discharge or even cause dangerous damage to the system if the electrical discharge is ignited via other system parts not provided for it. Therefore, these types of interfering layers must often be removed mechanically for the sake of process safety after each coating lot.

If a two-door concept is used, as shown in FIG. 1, there are very special demands on the concept of the door lock, which is not possible with conventional locks, since after the end of a vacuum process and flooding of the system at the ambient pressure, the compressive pressure of the second door, which is not supposed to be opened, also declines and increases the door gap. That way, dirt can get in between the seal and the seal surface and later cause leaks. Furthermore, with conventional systems using combustible or explosive gases, such as, for example, acetylene, methane, hydrogen, silane or the general risk of producing excess pressure, an additional safety device, like an excess pressure valve or the like must be provided.

TECHNICAL PROBLEM OF THE INVENTION

1) To prevent the expense of cleaning for the targets and/or auxiliary electrode(s) in the production of insulating or poorly conductive layers, as well as higher process safety and layer quality with a new target-shutter arrangement, 2) To increase pump capacity and prevent plasma formation in the pump area, especially in the pump support with a redesigned chevron.

3) At the same time, to create a user-friendly front-loader concept suitable for magnetic-field-supported processes that allows fast, easy loading/unloading and good access to the process chamber.

THE SOLUTION

The invention is explained in greater detail below using FIGS. 1 to 9, which show:

FIG. 1 a top view of a vacuum-treatment system
FIG. 2 a target/shutter arrangement
FIG. 3 a front view of a chevron
FIG. 4 a top view of a chevron/pump-support arrangement
FIG. 5 a folding coil
FIG. 6 a removable auxiliary anode head
FIGS. 7 to 9 a door lock The vacuum treatment system 1 shown in FIG. 1 is built in three pieces and basically consists of a front part 2, a relatively narrow middle part 3 and a pump support 5 connected to it, which is separated by a chevron 9 from the treatment chamber 10, as well as a back part 4. On the front and back part, there are, for example, several sputter cathodes 6 provided with shutters 8 and one or more radiant heating panels 7. Corresponding coating sources and/or heaters 7 can also be placed in the middle part. The front part 2 can fold all the way down from the middle part laterally by means of a joint, not shown here in detail to create a large loading aperture that allows simple loading/unloading. If the back part 4 is also designed as a folding door, the loading and unloading can be done from either side or from both sides at the same time, as desired. Advantageously, one or more workpiece holders (carousels) 11 placed so they can move and turn in the system, if necessary with workpiece holders mounted on them (small trees), for holding the workpieces to be coated, can be removed with a carousel-changer system, for example, a turn-table in the system 1 with a loading aperture. With such a system concept, servicing the system, like for example target changing or cleaning work, can be done very easily and in a user-friendly manner with the doors open.

The concept presented here was designed using a 2.8 cubic meter vacuum-treatment system for large throughputs of different-sized workpieces with an inner diameter of 1520 mm and a height of 1560 mm. The usable coating area has a diameter of 1200-1300 mm and a height of 800-900 mm.

One basic aspect to guarantee process safety—especially during free sputtering and deposition of a DLC layer by means of a pulsed bias supply and turned off target, is to choose the distance between the target and shutter 8 to allow ignition and maintenance of magnetron unloading behind closed shutters 8, on one hand but to prevent the production of auxiliary plasma behind the shutter 8 during the subsequent DLC coating, on the other. Surprisingly, it turns out that the geometric requirements for the production of plasma on the sputter cathode 6 and the auxiliary plasma induced by the pulse bias plasma are basically different and depend only very slightly on the process pressure, especially in a pressure range between 1 and $10 \times 10^{-3}$ mbar. It was also possible to discover similar connections for cathode spark vaporizers.

The behavior discovered is explained using the experiment shown in the following Table and FIG. 2. Here, a shutter 8, in the form of a sheet of metal 8' that can move laterally is placed in front of a square cathode 6 that has a chrome or graphite target 12 at different distances A, and the pressure is varied between $2 \times 10^{-3}$ and $7 \times 10^{-3}$ mbar. Then, it was attempted, on one hand, to ignite a plasma in the space between target 12 and shutter 8 by applying a voltage between anode frame 14 and cathode 12 and, on the other hand, by moving a carousel 11 with workpiece holders, not shown in greater detail here, with a pulse plasma ignited under the conditions of a DLC process to initiate an auxiliary plasma. Since the influence of the process pressure was scarcely measurable, it is not given in detail below.

Table of Ignition Distances:

| Shutter-Target Distance | Sputter Cathode Ignition | Auxiliary plasma Ignition |
|---|---|---|
| 5 mm | no | No |
| 10 mm | yes | No |
| 15 mm | yes | No |
| 20 mm | yes | No |
| 25 mm | yes | No |
| 30 mm | yes | No |
| 35 mm | yes | Yes |

It turned out that at a distance A of only 10 mm, a plasma ignited between the shutter 8 and the target 12, without a measurable leak flux occurring in the treatment chamber 10. On the other hand, the creation of an auxiliary plasma, which occurs due to the hollow cathode effect during the DLC process between target 12 and shutter 8, could only be observed from a distance of 35 mm.

Advantageously, therefore, the distance between the shutter and the target in a system in which both processes are carried out should be between 10 and 35 mm, especially approx. 20±5 mm. To prevent excessive flexure, especially of a larger shutter, a relatively thick sheet (in this case, approx. 3 mm) can be used and two lateral stiffeners provided by means of beveling.

To keep the target occupancy during reactive pulse bias processes behind the shutter 8 with the target turned off 6 as small as possible, an inert gas, for example argon, is blown directly onto the target surface by a gas distributor 13. It is also an advantage to have at least 10% to 20% of the target surface covered by the shutter and/or, as shown in FIG. 2 for example, basically full coverage of the mathematical surface between the gas distributors next to the cathodes.

FIGS. 3 and 4 show a chevron 9, and a chevron arrangement 9, according to the invention, in a vacuum-treatment system 1. In known vacuum-treatment systems, the chevron is placed in or directly on the pump support 5, which further reduces the cross section of the pump support. In the arrangement in the invention, between one or more pump supports 5 and the treatment chamber 10, an additional chevron chamber 17 is provided that has a much larger cross section 16 than that of at least one pump support cross section 15. At the same time, the distance B between pump support and chevron is selected to be so large that, here again, the free cross section is not narrowed.

This makes it possible to keep the free conductive cross section of the chevron 9 and the chevron chamber 17 always at least as large or larger than the pump support cross section 15, whereby the flow value, despite an intake line longer by B remains clearly larger than with a conventionally mounted chevron. It is particularly favorable if the chevron chamber, as can be seen in FIG. 4, can be built into the carrier frame 18 of the middle part 3, because then the additional expensive fabrication of the chevron chamber 17 is unnecessary.

To safely prevent ignition of an auxiliary plasma in the chevron chamber 17 and pump support 5, care must be taken that the holes chosen are small enough. For example, a grid with 1 mm mesh can be placed on the back of the chevron.

In the example of this system, the cross section 15 of three pump supports DN 320 has a surface area of 0.25 m². The cross section 16 of the chevron chamber 17, on the other hand, is 0.43 m² and is thus larger by a factor of 1.7.

The minimum distance of this chevron with side lengths of 1.4×0.3 m from the pump support input is at least 40 mm, preferably 60 mm.

With such an arrangement and one turbo molecular pump connected per pump support with a nominal suction capacity of 1550 l/min. each, a suction capacity of approx. 2500 l/min was able to be achieved. Instead of the chevron in the invention, if, as known, a chevron could be inserted directly into the pump support 5, a suction capacity of approx. 1650 l/min. is all that could be achieved. The increase compared to conventional arrangements is thus approx. 50% of the suction capacity.

Two ways of producing the above-mentioned remote magnetic field were tried, both of which allow simple access to the treatment chamber and hence a vacuum treatment system designed as a front or side loader. For this, the lower coil was designed once as a folding coil, and then as a coil with a smaller diameter. The upper coil remains geometrically unchanged with an inner radius of 825 mm.

Since such types of large coils, with diameters between 0.3 to 2 m or more, in order to produce the magnetic field needed for the process, with a line diameter of 2 to 10, preferably 4±1 mm, need 300 to 1200, preferably approx. 500 threads, certain structural measures are necessary to guarantee safe folding of one coil segment (20, 21') approx. 90° over the life of approx. 10,000 folding cycles. FIG. 5 shows the full view of such a folding coil 19 with two folding segmented bodies in the working position 20 during a magnet-supported plasma process, and in the folded down service position 20' guaranteeing easier access to the system.

To keep the differences in the bending radius of the individual coil planes small, the coil is laid out as flat (30-50 mm)

and wide (300-500 mm) as possible. Because of the cyclical material deformation and to balance out the different radii, highly flexible cables must be used that are wound so loosely in the bend area that the folding can be done without much tensile stress or pressure on the strands. To reduce the mutual friction of the strands in the bend area, silicon-sheathed cable was used. To prevent individual strands from pulling out, the cable was cast in segmented bodies 20 or coil bodies 21 produced from metal half shells. With such coil construction, despite a coil radius of 600-900 mm, good accessibility to the treatment chamber 10 was able to be achieved.

This is also possible using a small coil with a radius of approx. 200-400 mm. However, here it is difficult to achieve a homogeneous enough magnetic field over the whole height of the treatment chamber, thus guaranteeing even distribution of the plasma.

If very uniform plasma conditions are desired, a temporal change in current strength in one or both coils can be made or the direction of the current in one coil can be reversed. Thus, in the temporal mean of the individual process steps, such as heating, etching and DLC coating, for example, a uniform magnetic field can be produced, thus preventing plasma instability or non-homogeneous treatment results. For example, by reversing the current in the coils, completely homogeneous heating of the substrate over the entire system height can be achieved, thus effectively preventing overheating or critical process conditions. Such measures were able to produce similarly uniform heating rates and etching discharges over the coating area as with a folding coil, even with different sized coils. And the distribution of the coating thicknesses in a DLC process was in the range of ±10% of the mean.

Another advantageous aspect of the system in the invention is if, as shown in FIG. 6, an electrode 22 is used that allows the electrode head 23 to be changed quickly, where for example, the soiled head of an auxiliary anode is changed within seconds, and the time-consuming cleaning can be done outside the chamber.

An electrode head 23 made of a material with good conductivity and an appropriate thermal expansion coefficient in a cold electrode shell 24 with low tolerance fits so that, when cold, it can easily be removed and replaced with another head. For example, an electrode head 23 made of copper with a cylindrical fit and an inner diameter of 80 mm is easy to fit into an electrode shell 24 also made of copper, or to remove from it, if its diameter is made 0.2 to 0.4 mm larger. If such an electrode is used, for example as an auxiliary anode of a low-volt arc discharge, the electrode head 23 is heated by electron bombardment and expands. Since the electrode shell 24 will keep its shape unchanged by water cooling 27, the cylindrical lateral surfaces of the electrode head are pressed with great force against the shell 24, thus ensuring good electrical and thermal contact. The system remains in thermal balance. With a thermal expansion coefficient of $16.8 \times 10^{-6}/°$K, as with copper, with the diameter of the fit mentioned, a gap 26 of 0.2 or 0.4 is closed at a temperature differential of 150 or 300° C. The shell 24 is advantageously designed with a ventilation hole 25, which is connected to a hollow space provided between the electrode head 23 and the electrode shell 24 or a groove running along one cylinder circumference, not shown in detail here. Preferably, the cathode head material should have a thermal expansion coefficient at least equal to or greater than $10 \times 10^{-6}/°$K. But if low temperature differences are expected, such as roughly 50° to 100°, a suitable material with the highest possible expansion coefficient, for example copper or silver, should be selected. Since thermal compression can cause high forces to occur on the electrode head and shell, and good electrical conductivity is necessary at the same time, mainly metal materials can be used here. Alternately or in addition, structural measures can be taken, like spring-loaded mounting.

Another advantageous variation of the system can be achieved with a special door lock design, so that when closed, it ensures constant compressive pressure on the system door, on one hand, but on the other hand, serves as explosion protection at the same time, which allows the pressure inside to be released without endangering anyone. The possibility of setting a constant compressive pressure is an advantage, especially with double-door systems, since conventional locks on vacuum systems have some play, even if it is only a little. That way, coating material, dust, abrasion or the like stirred up during or after the flooding of the vacuum system can get in the gap between the door and the system or between the seal 37 and the seal surface. Then, if only one door is opened, it is not possible to clean the seal 37 and seal surface of the closed door, so there is a risk of a vacuum leak or damage to the seal 37 and seal surface.

The function of such a door lock will be explained by way of example using FIGS. 7 to 9. The individual components of the lock 28 are connected by a base plate 30 or directly, for example to the middle part 3 of the vacuum treatment system 1. The drive cylinder 29, mounted so it can turn on the axis 29', moves the lever 32 on an axis 32', whereby the tension arm 33 also mounted in turn on an axis 33' on the lever 32 is moved with the hook 35, which is spring-loaded or able to pivot, if necessary, on it. Thus, all functions can advantageously be triggered only by the rotary motion of two connected levers 32, 33 on the axis 32'. Alternatively, the tension arm 33 can also be attached in a fixed way to the lever 32, whereby the hook 35 is made, for example in the form of an inclined plane that acts on the door 38 or locking bar 39.

If, for example, as shown in FIG. 7, the pneumatic cylinder 29 is run out all the way to open, it moves the hook 35 via the arm 33 away from a locking bar 39 placed on the door 38 and, with the push pin 34, presses the arm 33 and hook 35 against the return spring 31, which holds the hook down in the snapped in position. After the door 38 opens, the compressed air cylinder 29 is cleared of compressed air, whereby the return spring pulls the hook 35 up to the push pin 36 into the resting position. Thus, the lock 28 is ready to snap in. The holding force necessary to seal the door 38 is applied by activating—in this case by running in—the pneumatic cylinder 29.

To ensure explosion protection, as shown in FIG. 8, the position of the locking bar 39 that goes into the hook 35 with the door 38 closed is chosen so that between the vector of the door force F acting when the system is under excess pressure and the connecting line V between the axes 32' and 33', a minimum angle α, which is dependent, on one hand, on the closing force of the pneumatic cylinder and, on the other, on the expected force, is set so that only one part of the force that occurs during an explosion goes into the frame, while the other part is used to press the pneumatic cylinder so far that the angle α is smaller. The size of the door gap created thereby can be adjusted by the angle α and by the distance between the axes 32' and 33'. For this system, the geometric ratios of the lock are chosen so that a door gap of 12 mm maximum is created. At this point, the door is prevented from further uncontrolled swinging by the massive hook 35 on the tension arm 33.

As is known to a person skilled in the art, if necessary, a similar device can be used with other components to perform a comparable function. The important thing is that the at least one damping member 29 and stop elements 33, 33', 35, 39 are designed for the maximum load expected, and it is possible to open the door easily at the same time. For example, for very large doors and very large excess pressures expected, it can be an advantage to use a hydraulic cylinder designed for large forces or to adjust the geometric ratios.

For example, on a two-door system for loading and standard cleaning, if only one door, the front door, for example, is opened, while the back door is used for service purposes only, the lock on the back door can be designed so a higher retaining force is produced. That way, the door can also be compressed, when flooded, with a force F, so that the distance between the door 38 and the seal 37 or seal surface is free of play, thus safely preventing the above-mentioned problem of potential damage to the seal surfaces. In the case of this system, a retaining force of approximately 15,000 kN is necessary. For this, it is possible, for example, in order to increase the lever effect, as shown in FIG. 9, to reduce the value of coordinate z for the distance between axes 32' and 33'. This can easily be done by moving the locking bar 39 back and inserting a distance plate 40. Thus, despite the high retaining force necessary, the corresponding pneumatic cylinder can be made relatively small. If the distance z', as shown, is chosen to be very small, the effect of the door force F would be a blockade of the opening mechanism, which can destroy the mechanism at high excess pressure. Therefore, the explosion protection function must be assumed by the other doors, as shown above, for example. Alternately, a somewhat larger distance z' and a somewhat stronger retaining cylinder 29 can also be provided, whereby two-level explosion protection is possible with locks 28 triggering at different door forces F.

The invention claimed is:

1. A vacuum treatment system (1) for treating workpieces, with a treatment chamber (10) that can be evacuated and in which a low-volt arc-discharge device is placed, at least one locking loading/unloading aperture, at least one coating source placed on one side wall of the treatment chamber, one device producing a magnetic field for creating a remote magnetic field and at least one workpiece holder for holding workpieces, characterized by the fact that at least one coating source is provided with a target-shutter arrangement (8,8') in which, when the shutter covers the target, the distance between the shutter (8) and the target (12) is maintained to be between 5 and 30 mm substantially across an entire area where the shutter (8) and the target (12) overlap, thus permitting, on one hand, the ignition and operation of a magnetron or a cathode spark discharge behind the target and, on the other hand, preventing the ignition of an auxiliary plasma with the target (8) turned off.

2. The vacuum treatment system in claim 1, characterized by the fact that it provides an electrode head (23) and an electrode shell (24) that can be cooled, whereby the electrode head (23) is attached in the electrode shell (24) and is made out of such a material that it forms a press fit with the cooled electrode shell (24) when heated, the electrode shell (24) including a U-shaped passage (27) configured to cool surfaces of the electrode shell (24) adjacent the electrode head (23).

3. The vacuum treatment system in claim 1, characterized by the fact that it provides a chevron arrangement for optical separation of at least one pump support (5) from the treatment chamber (10), which has a chevron chamber (17) between the pump support (5) and the chevron (9) with a larger cross section than the pump support, and the free line cross section of the chevron (9) is at least as large as the free cross section of the pump support.

4. The vacuum treatment system in claim 1, characterized by the fact that the device producing the magnetic field has a coil for producing a remote magnetic field, whereby the coil body (21) is attached on the outside to the vacuum treatment system (1), the coil body (21) is substantially maintained in a plane, and the coil is designed as a folding coil (19) with at least one collapsible segmented body (20, 20') such that the at least one collapsible segmented body (20, 20') can be folded away from the plane.

5. The vacuum treatment system in claim 1, characterized by the fact that a door lock is provided at the loading/unloading aperture, which has means (29 to 40) of setting a constant high compressive pressure, and basically the same means can be arranged so that the doors are controlled to open at an adjustable excess pressure to release the excess pressure.

6. The vacuum treatment system in claim 1, characterized by the fact that the shutter (8) and the target (12) are substantially equidistant along the area where the shutter (8) and the target (12) overlap.

7. The vacuum treatment system in claim 1, characterized by the fact that the shutter (8) and the target (12) are substantially parallel along the area where the shutter (8) and the target (12) overlap.

8. The vacuum treatment system in claim 1, characterized by the fact that a first surface of the shutter (8) substantially follows a second surface of the target (12) along the area where the shutter (8) and the target (12) overlap.

9. A method of treating workpieces with a vacuum treatment system (1) including a treatment chamber (10) that can be evacuated and in which a low-volt arc-discharge device is placed, at least one locking loading/unloading aperture, at least one coating source placed on one side wall of the treatment chamber, one device producing a magnetic field for a remote magnetic field and at least one workpiece holder for holding workpieces, the at least one coating source includes a target-shutter arrangement (8, 8') in which the distance between a shutter (8) and a target (12) is maintained at a distance apart substantially across an entire area where the shutter (8) and the target (12) overlap, the method comprising the step of:

maintaining the distance within 5 and 30 mm when the shutter covers the target thus permitting, on one hand, the ignition and operation of a magnetron or a cathode spark discharge behind the target and, on the other hand, preventing the ignition of an auxiliary plasma with the target (8) turned off.

10. The vacuum treatment system of claim 1, characterized by the fact that the treatment chamber (10) is maintained at a pressure range of $1 \times 10^{-3}$ and $10 \times 10^{-3}$ mbar.

11. The vacuum treatment system of claim 1, characterized by the fact that the distance between the shutter (8) and the target (12) is maintained to be between 10 and 30 mm substantially across an entire area where the shutter (8) and the target (12) overlap.

12. The vacuum treatment system of claim 1, characterized by the fact that the shutter is flat.

* * * * *

UNITED STATES PATENT AND TRADEMARK OFFICE
CERTIFICATE OF CORRECTION

| | | |
|---|---|---|
| PATENT NO. | : 7,905,991 B2 | |
| APPLICATION NO. | : 11/272216 | |
| DATED | : March 15, 2011 | |
| INVENTOR(S) | : Markus Esselbach et al. | |

It is certified that error appears in the above-identified patent and that said Letters Patent is hereby corrected as shown below:

In the Specification, column 1, line 44, insert -- cites at -- between "it" and "least"

Signed and Sealed this
Thirty-first Day of May, 2011

David J. Kappos
*Director of the United States Patent and Trademark Office*